United States Patent
Chen et al.

(10) Patent No.: US 8,564,080 B2
(45) Date of Patent: Oct. 22, 2013

(54) MAGNETIC STORAGE ELEMENT UTILIZING IMPROVED PINNED LAYER STACK

(75) Inventors: Wei-Chuan Chen, San Diego, CA (US); Seung H. Kang, San Diego, CA (US); Xiaochun Zhu, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 252 days.

(21) Appl. No.: 12/837,535

(22) Filed: Jul. 16, 2010

(65) Prior Publication Data

US 2012/0012952 A1    Jan. 19, 2012

(51) Int. Cl.
*H01L 29/82* (2006.01)
*G11C 11/02* (2006.01)

(52) U.S. Cl.
USPC ........... 257/421; 257/422; 257/423; 257/425; 257/426; 257/427; 438/3; 360/324.2; 365/157; 365/158

(58) Field of Classification Search
USPC ............ 257/421–427, E29.323; 438/3; 365/157–158; 360/324–326
See application file for complete search history.

(56) References Cited

U.S. PATENT DOCUMENTS

| | | | |
|---|---|---|---|
| 2005/0185454 A1* | 8/2005 | Brown et al. | 365/171 |
| 2008/0239591 A1* | 10/2008 | Fuji et al. | 360/324.12 |
| 2008/0316657 A1* | 12/2008 | Zhang et al. | 360/324.11 |
| 2009/0161422 A1* | 6/2009 | Zhu et al. | 365/171 |
| 2009/0168493 A1* | 7/2009 | Kim et al. | 365/148 |
| 2009/0247814 A1 | 10/2009 | Parker | |

OTHER PUBLICATIONS

International Search Report and Written Opinion—PCT/US2011/043992—ISA/EPO—Jan. 17, 2012.

* cited by examiner

*Primary Examiner* — Jami M Valentine
(74) *Attorney, Agent, or Firm* — Sam Talpalatsky; Nicholas J. Pauley; Joseph Agusta

(57) ABSTRACT

A magnetic tunnel junction (MTJ) storage element may comprise a pinned layer stack and a first functional layer. The pinned layer stack is formed of a plurality of layers comprising a bottom pinned layer, a coupling layer, and a top pinned layer. The first functional layer is disposed in the bottom pinned layer or the top pinned layer.

35 Claims, 10 Drawing Sheets

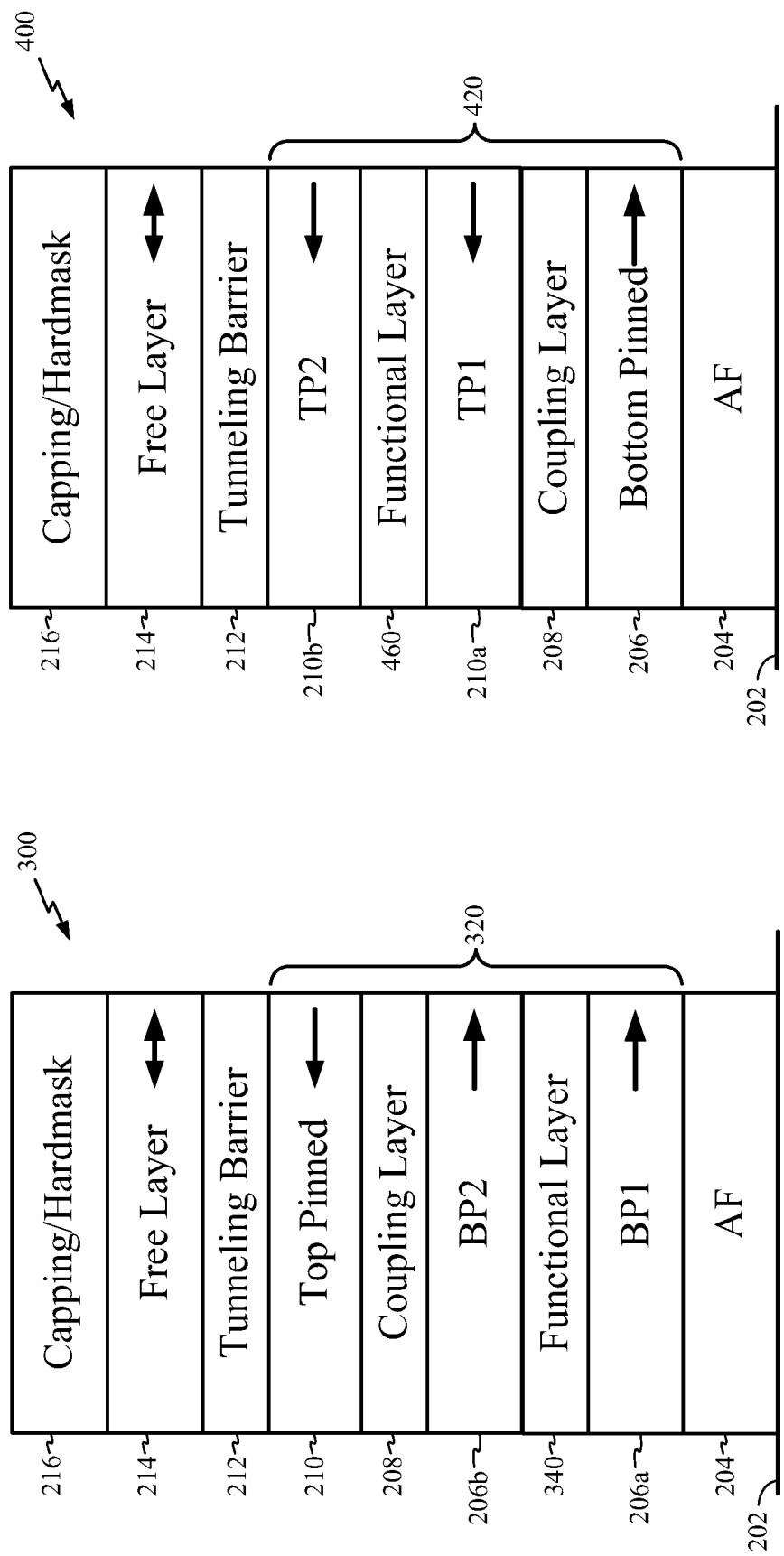

MAGNETIC STORAGE ELEMENT UTILIZING IMPROVED PINNED LAYER STACK

FIELD OF DISCLOSURE

Disclosed embodiments are related to employing an improved pinned layer stack in a Magnetic Tunnel Junction (MTJ) storage element usable in a Spin Transfer Torque Magnetoresistive Random Access Memory (STT-MRAM) cell.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

FIG. 1 illustrates a conventional STT-MRAM bit cell 100. The STT-MRAM bit cell 100 includes Magnetic Tunnel Junction (MTJ) storage element 105, a transistor 101, a bit line 102 and a word line 103. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned (parallel) or opposite (anti-parallel). The resistance of the electrical path through the MTJ will vary depending on the alignment of the polarizations of the pinned and free layers. This variance in resistance can be used to program and read the bit cell 100. The STT-MRAM bit cell 100 also includes a source line 104, a sense amplifier 108, read/write circuitry 106 and a bit line reference 107.

Those skilled in the art will appreciate the operation and construction of the memory cell 100. For example, the bit cell 100 may be programmed such that a binary value "1" is associated with an operational state wherein the polarity of the free layer is parallel to the polarity of the pinned layer. Correspondingly, a binary value "0" may be associated with an anti-parallel orientation between the two ferromagnetic layers. A binary value may thus be written to the bit cell by changing the polarization of the free layer.

FIG. 2 illustrates a conventional design of the MTJ cell 105 in more detail. An antiferromagnetic (AF) layer 204 is first formed on a bottom electrode 202, and then a pinned layer stack 220 is formed on top of the AF layer 204. The AF layer 204 may be formed from a platinum-manganese (PtMn) alloy, for example. The pinned layer stack 220 is "pinned" with a fixed magnetic polarization to form a pinned layer. The pinned layer stack may include one or more layers. The pinned layer stack 220 may sometimes be referred to as a composite AF pinned layer or a "synthetic" AF (SAF) pinned layer. The pinned layer stack 220 may include a bottom pinned layer 206 typically formed of a metal alloy such as cobalt-iron (CoFe) and/or cobalt-iron-boron (CoFeB), a coupling layer 208 typically formed of a non-magnetic metal such as ruthenium (Ru), and a top pinned layer 210 typically formed of a metal alloy such as CoFe and/or CoFeB. A tunneling barrier layer 212 is formed of an insulator such as a metal oxide like magnesium-oxide (MgO) on top of the pinned layer stack 220. A free layer 214 with variable magnetic polarization is formed on top of the barrier layer 212. In some designs, a capping or hardmask layer 216 such as tantalum (Ta) is formed on top of the free layer 214.

The conventional MTJ design of FIG. 2 has several drawbacks. One drawback is that high temperature back-end processes may allow diffusion of undesirable materials from one layer to another. For example, a high temperature annealing process for setting a desired magnetic moment of a PtMn AF layer 204 may mobilize Mn atoms and allow them to diffuse from the AF layer 204 into the bottom pinned layer 206, the coupling layer 208, the top pinned layer 210, and even as far as the tunneling barrier layer 212. Ru atoms of the coupling layer 208 may be similarly diffused throughout the various other layers by one or more high temperature back-end processes. The diffusion of undesirable elements throughout the MTJ stack may inhibit or destroy antiferromagnetic coupling of the pinned layer stack 220, decay exchange coupling between the AF layer 204 and the pinned layer stack 220, damage inter-layer interfaces (resulting in poor thermal stability, etc.), reduce the magnetoresistance of the MTJ cell, or even prevent the MTJ cell from being able switch between states. Accordingly, there is a need for an improved pinned layer stack for MTJ storage elements usable in STT-MRAM cells.

SUMMARY

Exemplary embodiments of the invention are directed to systems and method for an improved pinned layer stack in a Magnetic Tunnel Junction (MTJ) storage element usable in a Spin Transfer Torque Magnetoresistive Random Access Memory (STT-MRAM) cell.

In one embodiment, an MTJ storage element comprises a pinned layer stack and a first functional layer. The pinned layer stack is formed of a plurality of layers comprising a bottom pinned layer, a coupling layer, and a top pinned layer. The first functional layer is disposed in the bottom pinned layer or the top pinned layer.

In another embodiment, a method of forming an MTJ storage element comprises: depositing and forming a plurality of layers comprising a bottom pinned layer, a coupling layer, and a top pinned layer to form a pinned layer stack; and depositing and forming a first functional layer disposed in the bottom pinned layer or the top pinned layer.

In another embodiment, an MTJ storage element comprises a pinned layer stack and first means for protecting the pinned layer stack. The pinned layer stack is formed from a plurality of layers comprising a bottom pinned layer, a coupling layer, and a top pinned layer. The first means is disposed in the bottom pinned layer or the top pinned layer.

In another embodiment, a method of forming an MTJ storage element comprises: step for depositing and forming a plurality of layers comprising a bottom pinned layer, a coupling layer, and a top pinned layer to form a pinned layer stack; and step for depositing and forming a first functional layer disposed in the bottom pinned layer or the top pinned layer.

BRIEF DESCRIPTION OF THE DRAWINGS

The accompanying drawings are presented to aid in the description of embodiments of the invention and are provided solely for illustration of the embodiments and not limitation thereof.

FIG. 3 illustrates an MTJ cell including a functional layer disposed in a bottom pinned layer of a pinned layer stack according to an example embodiment.

FIG. 4 illustrates an MTJ cell including a functional layer disposed in a top pinned layer of a pinned layer stack according to an example embodiment.

DETAILED DESCRIPTION

Figure 1:
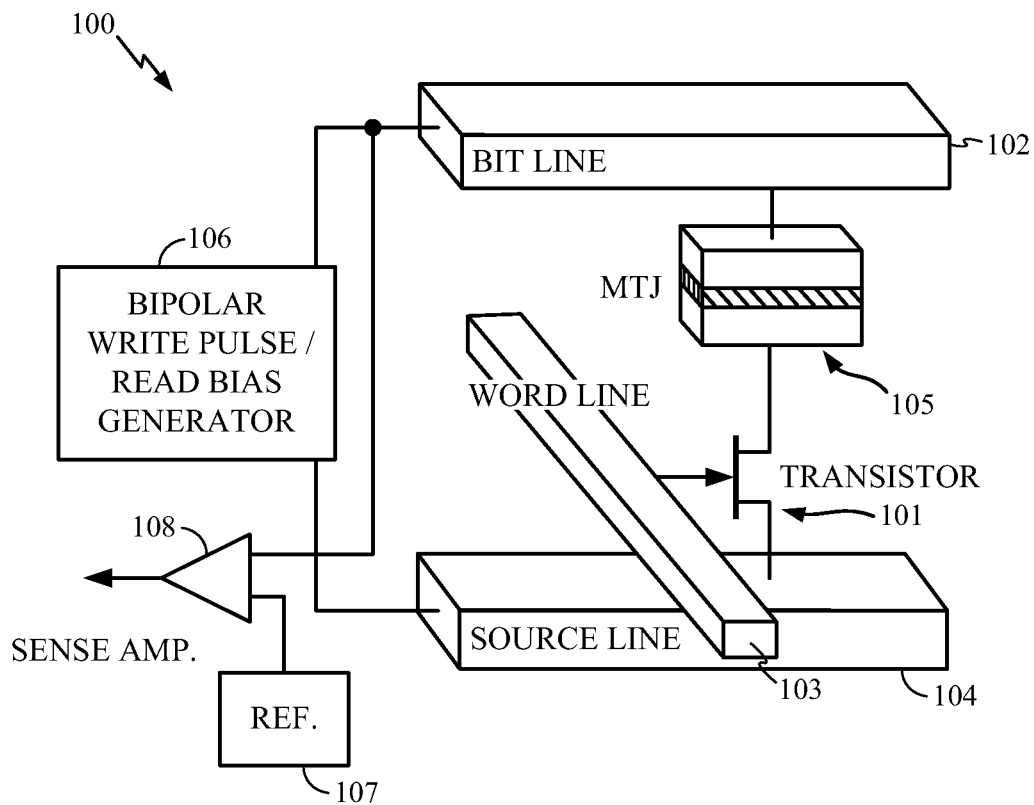
FIG. 1 illustrates a conventional STT-MRAM bit cell.
Figure 2:
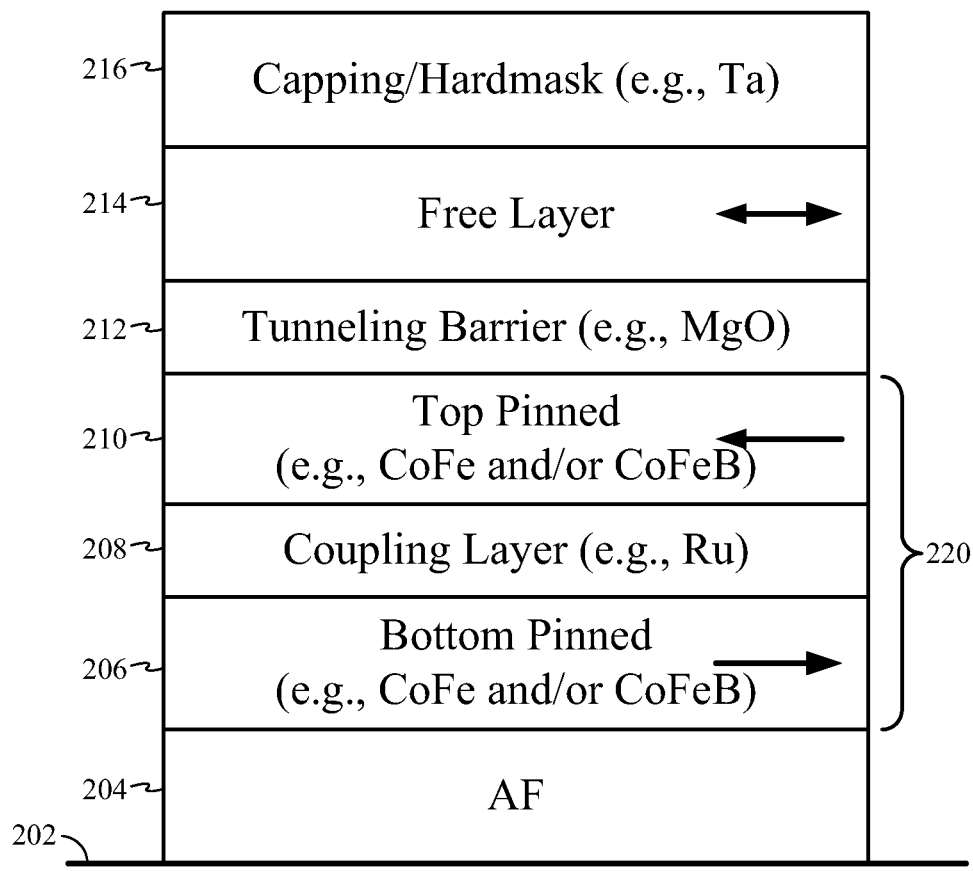
FIG. 2 illustrates a conventional design of the MTJ cell in more detail.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. The terminology used herein is for the purpose of describing particular embodiments only and is not intended to be limiting of embodiments of the invention.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The disclosed embodiments recognize that, with conventional methods, materials from one layer may be undesirably diffused into one or more other layers by routine high temperature back-end manufacturing processes. The diffusion of such materials leads to a number of detrimental effects in Magnetic Tunnel Junction (MTJ) storage elements usable in a Spin Transfer Torque Magnetoresistive Random Access Memory (STT-MRAM) cells, such as inhibiting or destroying antiferromagnetic coupling of a given layer stack, decaying exchange coupling between two given layers, damaging inter-layer boundaries (resulting in poor thermal stability, etc.), reducing magnetoresistance of the MTJ, or even preventing the MTJ from being able to switch states. Accordingly, techniques are presented herein to prevent and/or repair various diffusion related problems in MTJ cells by inserting one or more functional layers within a pinned layer stack of the MTJ cell. That is, the functional layers protect the pinned layer stack from high-temperature diffusion of material through the plurality of layers. The inserted functional layers are typically relatively thin, on the order a nanometer or so, as compared to overall pinned layer stack height. The various features and advantages of the disclosed techniques will become more readily apparent from the description below.

FIG. 3 illustrates an MTJ cell 300 including a functional layer disposed in a bottom pinned layer of a pinned layer stack according to an example embodiment. The MTJ cell 300 includes an antiferromagnetic (AF) layer 204 (e.g., PtMn) formed on a bottom electrode 202 and a pinned layer stack 320 formed on top of the AF layer 204. The pinned layer stack 320 is "pinned" with a fixed magnetic polarization. In the design of FIG. 3, the pinned layer stack 320 includes a first bottom pinned layer 206a (BP1) (e.g., CoFe and/or CoFeB) and a second bottom pinned layer 206b (BP2) (e.g., CoFe and/or CoFeB) interposed by a functional layer 340. The pinned layer stack 320 further includes a coupling layer 208 (e.g., Ru) and a top pinned layer 210 (e.g., CoFe and/or CoFeB). The MTJ cell 300 further includes a tunneling barrier layer 212 (e.g., MgO), a free layer 214, and a capping/hardmask layer 216 (e.g., Ta).

As will be described in more detail below, the insertion of a functional layer within a bottom pinned layer of a pinned layer stack may be used to impede or block the diffusion of undesired materials through the bottom pinned layer. For example, the functional layer 340 of FIG. 3 may impede or block the diffusion of Mn atoms or the like from the AF layer 204 and the diffusion of Ru atoms or the like from the coupling layer 208. The insertion of a functional layer within a bottom pinned layer of a pinned layer stack may also be used to enhance coupling layer crystallization inhibited or damaged by the diffusion of undesirable materials. For example, the functional layer 340 of FIG. 3 may enhance Ru crystallization or the like in the coupling layer 208, thereby improving antiferromagnetic coupling strength. The insertion of a functional layer within a bottom pinned layer of a pinned layer stack may also be used to smooth the pinned layer interface by providing an amorphous surface. For example, the functional layer 340 may help to smooth the interface between the second bottom pinned layer 206b and the coupling layer 208, thereby providing improved thermal stability, etc.

FIG. 4 illustrates an MTJ cell 400 including a functional layer disposed in a top pinned layer of a pinned layer stack according to an example embodiment. The MTJ cell 400 includes an AF layer 204 (e.g., PtMn) formed on a bottom electrode 202 and a pinned layer stack 420 formed on top of the AF layer 204. The pinned layer stack 420 is "pinned" with a fixed magnetic polarization. The pinned layer stack 420 includes a bottom pinned layer 206 (e.g., CoFe and/or CoFeB) and a coupling layer 208 (e.g., Ru). In the design of FIG. 4, the pinned layer stack 420 further includes a first top pinned layer 210a (TP1) (e.g., CoFe and/or CoFeB) and a second top pinned layer 210b (TP2) (e.g., CoFe and/or CoFeB) interposed by a functional layer 460. The MTJ cell 400 further includes a tunneling barrier layer 212 (e.g., MgO), a free layer 214, and a capping/hardmask layer 216 (e.g., Ta).

As will be described in more detail below, the insertion of a functional layer within a top pinned layer of a pinned layer stack may be used to impede or block the diffusion of undesired materials through the top pinned layer. For example, the functional layer 460 may impede or block the diffusion of Ru atoms or the like from the coupling layer 208. The insertion of a functional layer within a top pinned layer of a pinned layer stack may also be used to enhance tunneling barrier crystallization inhibited or damaged by the diffusion of undesirable materials. For example, the functional layer 340 may enhance MgO crystallization or the like in the tunneling barrier 212, thereby increasing magnetoresistance and reducing the required temperature for one or more annealing processes. The insertion of a functional layer within a top pinned layer of a pinned layer stack may also be used to smooth the pinned layer interface by providing an amorphous surface. For example, the functional layer 460 may smooth the interface between the first top pinned layer 210b and the coupling layer 208, thereby providing improved thermal stability, etc.

In some designs, functional layers may be disposed within both a bottom pinned layer and a top pinned layer of a pinned layer stack. Such a combination of functional layers may be used to achieve the individual advantages described above with regard to FIGS. 3 and 4 in concert.

Figure 5:
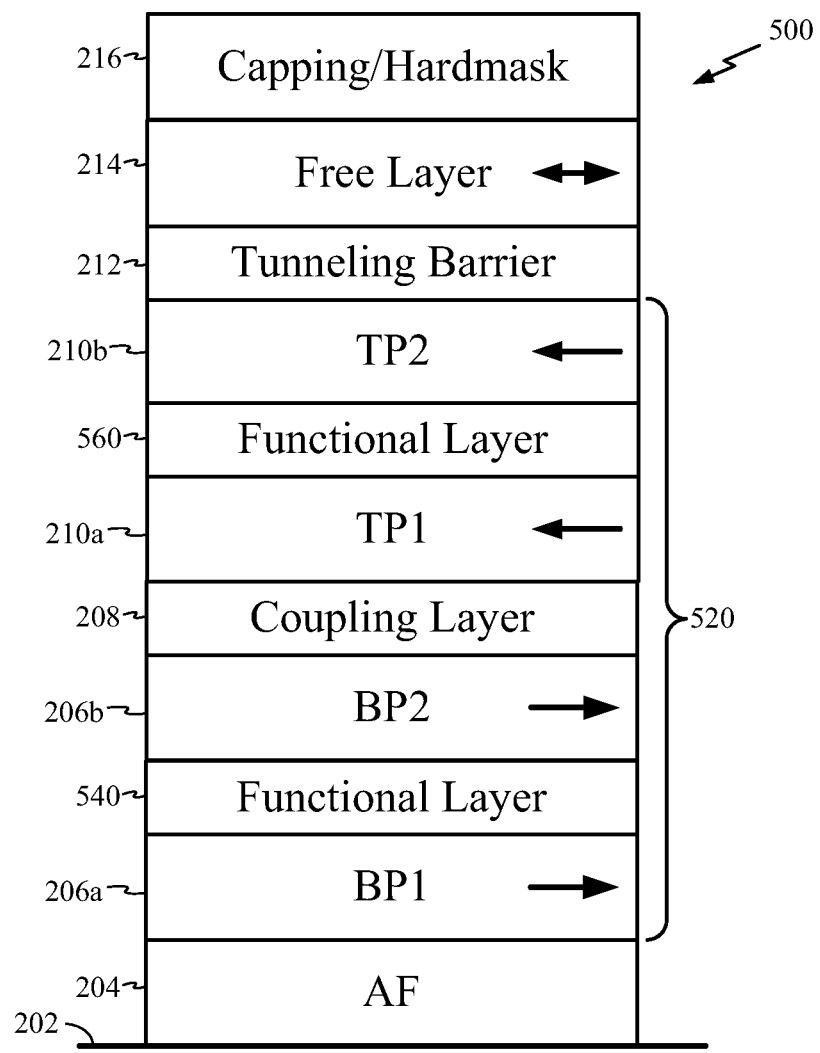
FIG. 5 illustrates an MTJ cell including both a functional layer disposed in a bottom pinned layer of a pinned layer stack and a functional layer disposed in a top pinned layer of the pinned layer stack according to an example embodiment.

FIG. 5 illustrates an MTJ cell 500 including both a functional layer disposed in a bottom pinned layer of a pinned layer stack and a functional layer disposed in a top pinned layer of the pinned layer stack according to an example embodiment. The MTJ cell 500 includes an AF layer 204 (e.g., PtMn) formed on a bottom electrode 202 and a pinned layer stack 520 formed on top of the AF layer 204. The pinned layer stack 520 is "pinned" with a fixed magnetic polarization. In the design of FIG. 5, the pinned layer stack 520 includes a first bottom pinned layer 206a (BP1) (e.g., CoFe and/or CoFeB) and a second bottom pinned layer 206b (BP2) (e.g., CoFe and/or CoFeB) interposed by a first functional layer 540. The pinned layer stack 520 also includes a coupling layer 208 (e.g., Ru). The pinned layer stack 520 further includes a first top pinned layer 210a (TP1) (e.g., CoFe and/or CoFeB) and a second top pinned layer 210b (TP2) (e.g., CoFe and/or CoFeB) interposed by a second functional layer 560. The MTJ cell 500 further includes a tunneling barrier layer 212 (e.g., MgO), a free layer 214, and a capping/hardmask layer 216 (e.g., Ta).

The particular advantages achieved by inserting a functional layer within a bottom pinned layer and/or a top pinned layer of a pinned layer stack depend on the type of functional layer(s) employed. Various types of functional layers providing various advantages are realizable by selecting an appropriate material or composition of materials from which to form each functional layer. For example, functional layers may be formed of materials including tantalum (Ta), titanium (Ti), chromium (Cr), ruthenium (Ru), hafnium (Hf), platinum (Pt), a hafnium-oxide (HfOx), a cobolt-iron-oxide (CoFeOx), a cobalt-iron-tantalum alloy (CoFeTa), a cobalt-iron-tantalum-oxide (CoFeTaOx), a cobalt-iron-boron-tantalum alloy (CoFeBTa), a cobalt-chromium alloy (CoCr), a cobalt-ruthenium alloy (CoRu), a cobalt-chromium-ruthenium alloy (CoCrRu), a cobalt-chromium-tantalum alloy (CoCrTa), a cobalt-chromium-tantalum-oxide (CoCrTaOx), magnetic alloys of Hf, non-magnetic alloys of Hf, or other materials known in the art, depending on the desired effects.

Figure 6:
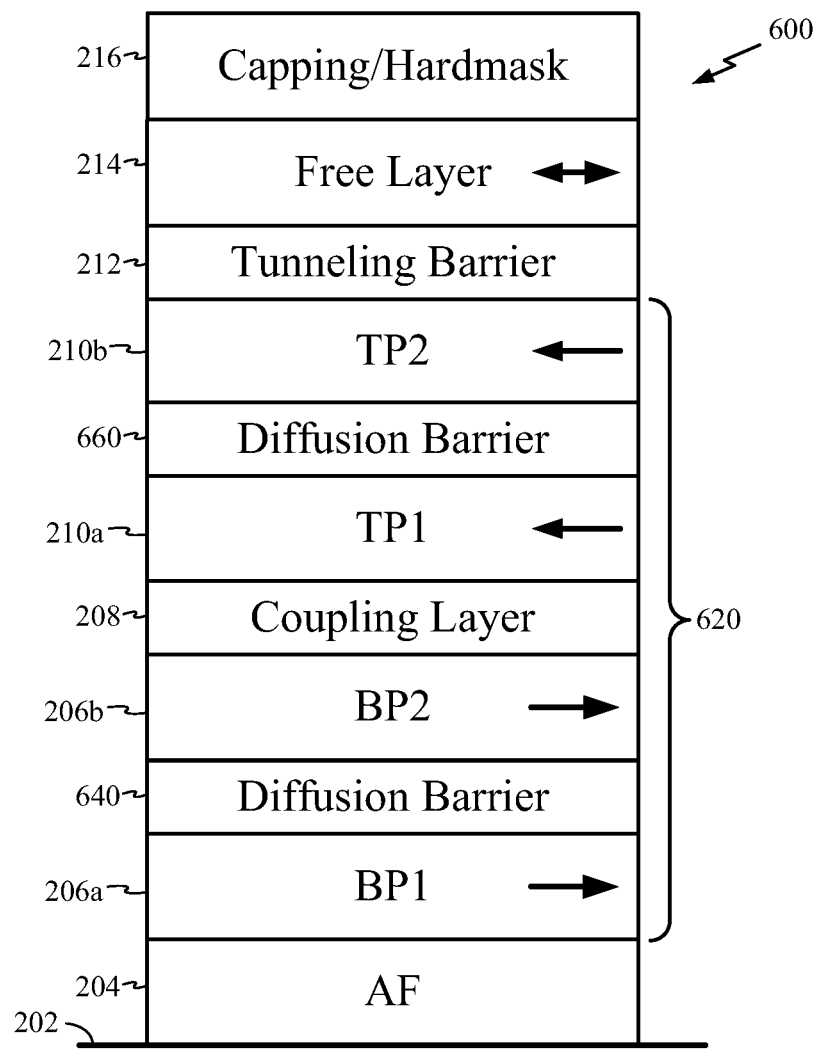
FIG. 6 illustrates an MTJ cell including diffusion-barrier functional layers according to an example embodiment.

FIG. 6 illustrates an MTJ cell 600 including diffusion-barrier functional layers according to an example embodiment. As shown, the MTJ cell 600 includes a bottom electrode 202, an AF layer 204 (e.g., PtMn), a first bottom pinned layer 206a (BP1) (e.g., CoFe and/or CoFeB), a first diffusion-barrier functional layer 640, a second bottom pinned layer 206b (BP2) (e.g., CoFe and/or CoFeB), a coupling layer 208 (e.g., Ru), a first top pinned layer 210a (TP1) (e.g., CoFe and/or CoFeB), a second diffusion-barrier functional layer 660, a second top pinned layer 210b (TP2) (e.g., CoFe and/or CoFeB), a tunneling barrier layer 212 (e.g., MgO), a free layer 214, and a capping/hardmask layer 216 (e.g., Ta). The first and second bottom pinned layer 206a, 206b, the first and second top pinned layers 210a, 210b, the first and second diffusion-barrier functional layers 640, 660, and the coupling layer 208 form a pinned layer stack 620. Two diffusion-barrier functional layers 640, 660, one interposed between the first and second bottom pinned layers 206a, 206b, and one interposed between the first and second top pinned layers 210a, 210b, are shown for illustration purposes. However, it will be appreciated in view of the discussion above that other functional layer types and configurations are possible.

Each diffusion-barrier functional layer 640, 660 may be formed from, for example, a cobolt-iron-oxide (CoFeOx), a hafnium-oxide (HfOx), a magnetic alloy including Hf, a non-magnetic alloy including Hf, or any other diffusion-barrier material known in the art. The diffusion-barrier functional layers 640, 660 may be used to impede or block the diffusion of undesired materials, such as by trapping Mn atoms of a PtMn AF layer 204 or Ru atoms of a Ru coupling layer 208.

Figure 7:
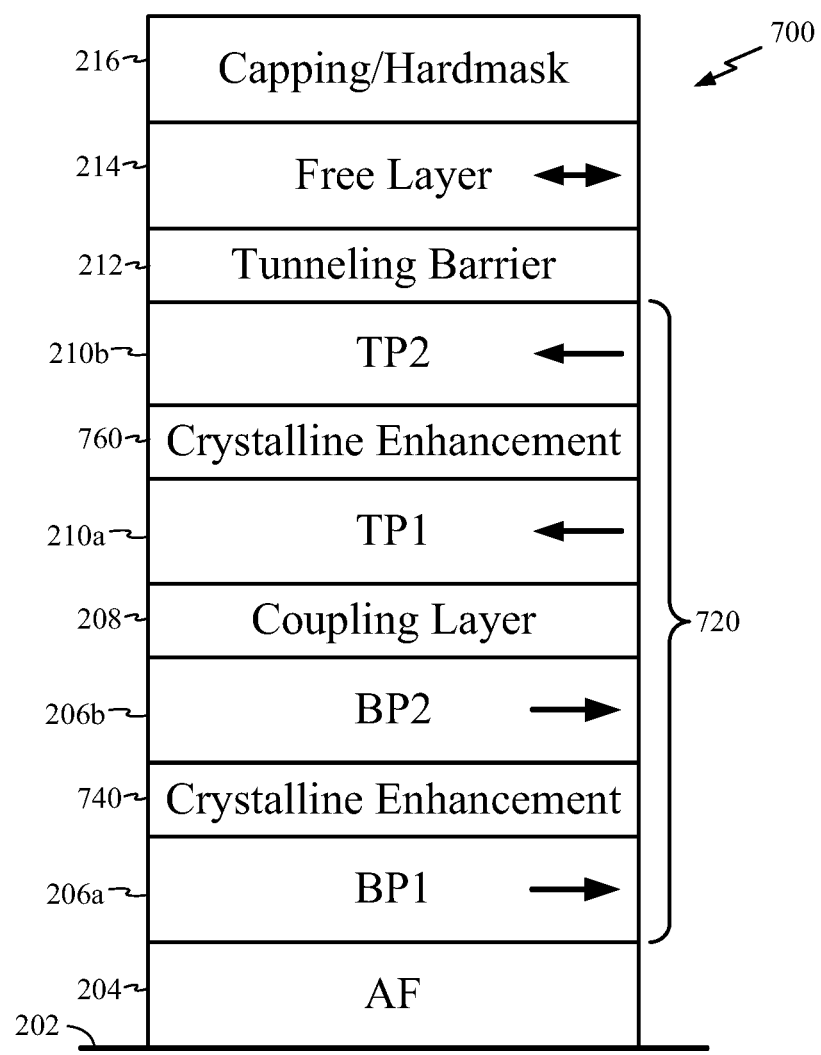
FIG. 7 illustrates an MTJ cell including crystalline-enhancement functional layers according to an example embodiment.

FIG. 7 illustrates an MTJ cell 700 including crystalline-enhancement functional layers according to an example embodiment. As shown, the MTJ cell 700 includes a bottom electrode 202, an AF layer 204 (e.g., PtMn), a first bottom pinned layer 206a (BP1) (e.g., CoFe and/or CoFeB), a first crystalline-enhancement functional layer 740, a second bottom pinned layer 206b (BP2) (e.g., CoFe and/or CoFeB), a coupling layer 208 (e.g., Ru), a first top pinned layer 210a (TP1) (e.g., CoFe and/or CoFeB), a second crystalline-enhancement functional layer 760, a second top pinned layer 210b (TP2) (e.g., CoFe and/or CoFeB), a tunneling barrier layer 212 (e.g., MgO), a free layer 214, and a capping/hardmask layer 216 (e.g., Ta). The first and second bottom pinned layer 206a, 206b, the first and second top pinned layers 210a, 210b, the first and second crystalline-enhancement functional layers 740, 760, and the coupling layer 208 form a pinned layer stack 720. Two crystalline-enhancement functional layers 740, 760, one interposed between the first and second bottom pinned layers 206a, 206b, and one interposed between the first and second top pinned layers 210a, 210b, are shown for illustration purposes. However, it will be appreciated in view of the discussion above that other functional layer types and configurations are possible.

Each crystalline-enhancement functional layer 740, 760 may be formed from, for example, Ta, or any other crystalline-enhancement material known in the art. In general, any body-centered-cubic (BCC) material, or combination thereof, may be used, including both magnetic materials (e.g., Fe, FeB, CoFe, FePt, CoPt, CoFePt, CoCr, CoCrTa) and non-magnetic materials (e.g., Ta, Cr, Mo, CrRu, CrMo). The crystalline-enhancement functional layers 740, 760 may be used to increase the strength of Ruderman-Kittel-Kasuya-Yosida ("RKKY") coupling of the pinned layer stack 720 by enhancing the crystallization of Ru atoms in the coupling layer 208. The crystalline-enhancement functional layers 740, 760 may also be used to reduce a required annealing temperature by enhancing crystallization of MgO in the tunneling barrier layer 212. The crystalline-enhancement functional layers 740, 760 may also be used to smooth the interface between the first top pinned layer 210a and the second bottom pinned layer 206b by enhancing crystallization of Ru atoms in the coupling layer 208, which may lead to improved thermal stability.

Figure 8:
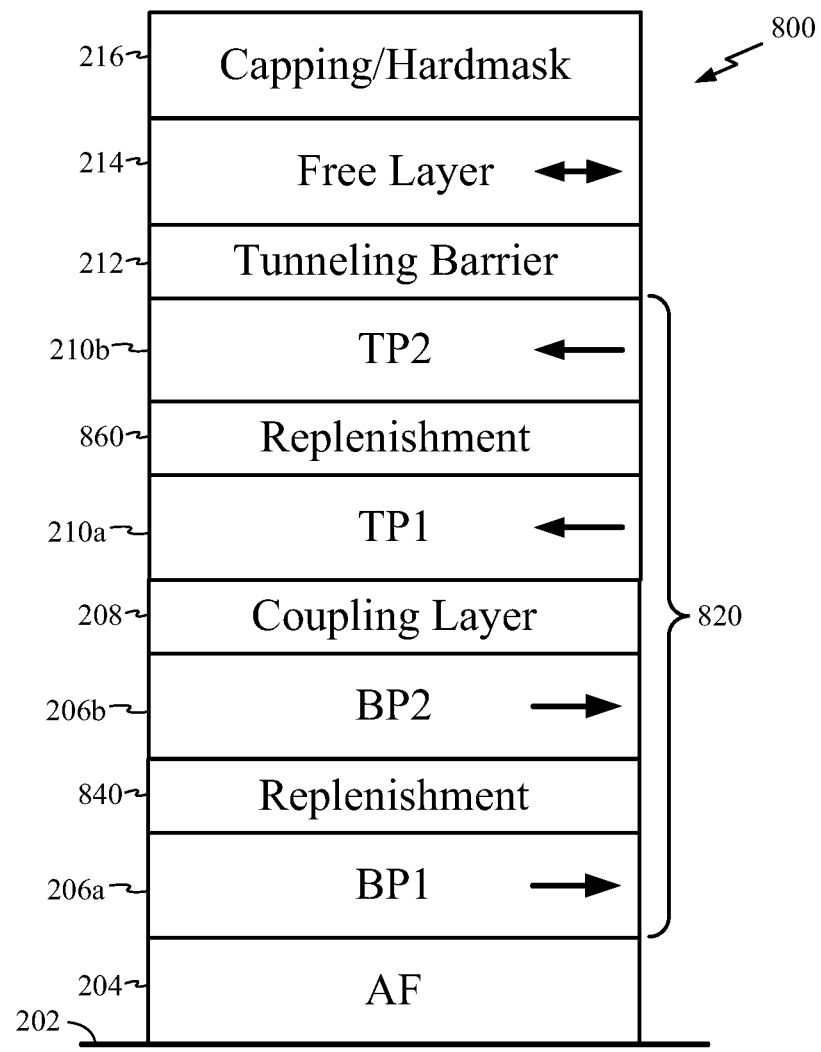
FIG. 8 illustrates an MTJ cell including replenishment functional layers according to an example embodiment.

FIG. 8 illustrates an MTJ cell 800 including replenishment functional layers according to an example embodiment. As shown, the MTJ cell 800 includes a bottom electrode 202, an AF layer 204 (e.g., PtMn), a first bottom pinned layer 206a (BP1) (e.g., CoFe and/or CoFeB), a first replenishment functional layer 840, a second bottom pinned layer 206b (BP2) (e.g., CoFe and/or CoFeB), a coupling layer 208 (e.g., Ru), a first top pinned layer 210a (TP1) (e.g., CoFe and/or CoFeB), a second replenishment functional layer 860, a second top pinned layer 210b (TP2) (e.g., CoFe and/or CoFeB), a tunneling barrier layer 212 (e.g., MgO), a free layer 214, and a capping/hardmask layer 216 (e.g., Ta). The first and second bottom pinned layer 206a, 206b, the first and second top pinned layers 210a, 210b, the first and second replenishment functional layers 840, 860, and the coupling layer 208 form a pinned layer stack 820. Two replenishment functional layers 840, 860, one interposed between the first and second bottom pinned layers 206a, 206b, and one interposed between the first and second top pinned layers 210a, 210b, are shown for illustration purposes. However, it will be appreciated in view of the discussion above that other functional layer configurations are possible.

Each replenishment functional layer 840, 860 may be formed from, for example, Ru or a Ru-alloy, or any other replenishment material known in the art. The replenishing atoms of the replenishment functional layers 840, 860 may prevent the diffusion of Ru atoms in the coupling layer 208 or Mn atoms in the PtMn AF layer 204, for example, by occupying the vacancy sites of neighboring layers such as the first and second bottom pinned layers 206a, 206b, and the first and second top pinned layers 210a, 210b.

The particular advantages achieved by inserting the different types of functional layers described above with reference to FIGS. 6-8 can be combined by using two or more of the functional layers in concert.

Figure 9:
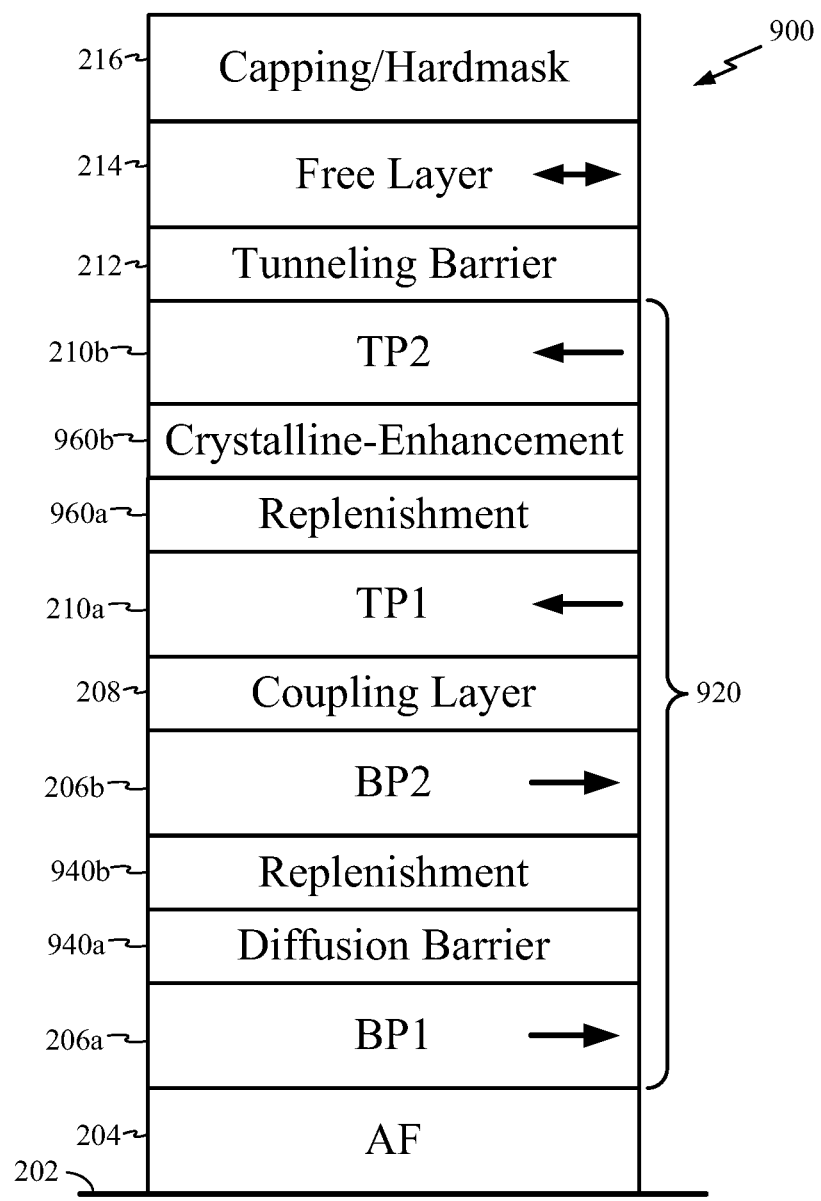
FIG. 9 illustrates an MTJ cell including two functional layers disposed in a bottom pinned layer of a pinned layer stack and two functional layers disposed in a top pinned layer of the pinned layer stack according to an example embodiment.

FIG. 9 illustrates an MTJ cell 900 including two functional layers disposed in a bottom pinned layer of a pinned layer stack and two functional layers disposed in a top pinned layer of the pinned layer stack according to an example embodiment. As in the preceding designs, the MTJ cell 900 includes a bottom electrode 202, an AF layer 204 (e.g., PtMn), a pinned layer stack 920, a tunneling barrier layer 212 (e.g., MgO), a free layer 214, and a capping/hardmask layer 216 (e.g., Ta). In the design of FIG. 9, however, the pinned layer stack 920 includes a first bottom pinned layer 206a (BP1) (e.g., CoFe and/or CoFeB) and a second bottom pinned layer 206b (BP2) (e.g., CoFe and/or CoFeB) interposed by both a first bottom functional layer 940a and a second bottom functional layer 940b. The pinned layer stack 920 also includes a coupling layer 208 (e.g., Ru). The pinned layer stack 920 further includes a first top pinned layer 210a (TP1) (e.g., CoFe and/or CoFeB) and a second top pinned layer 210b (TP2) (e.g., CoFe and/or CoFeB) interposed by a first top functional layer 960a and a second top functional layer 960b.

In FIG. 9, the first bottom functional layer 940a is shown as a diffusion-barrier functional layer, the second bottom functional layer 940b is shown as replenishment functional layer, the first top functional layer 960a is shown as a replenishment functional layer, and the second top functional layer 960b is shown as a crystalline-enhancement functional layer. The particular types, ordering, and number of functional layers shown are for illustration purposes only. It will be appreciated that any combination, ordering, or number of functional layers is possible.

Figure 10:
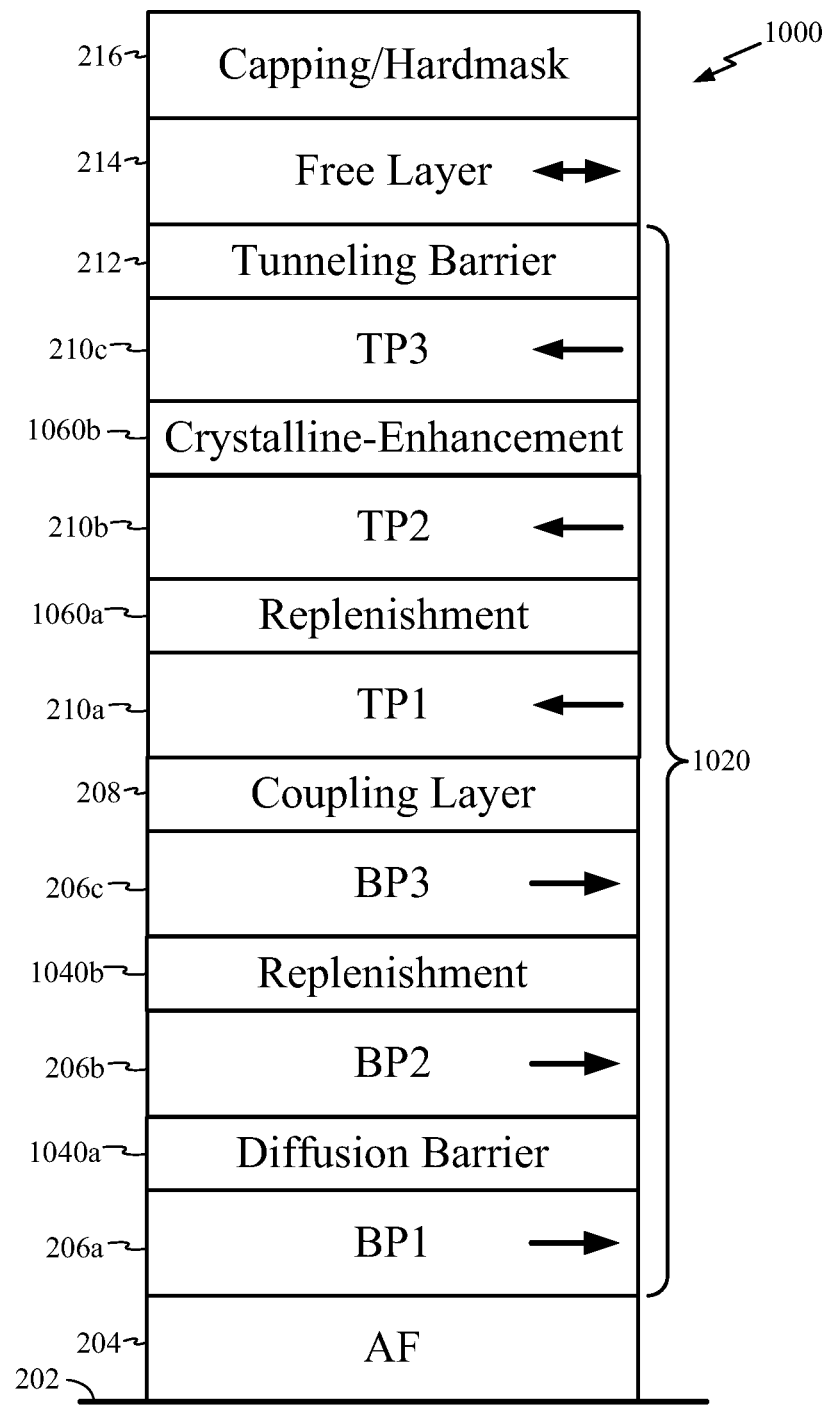
FIG. 10 illustrates another MTJ cell including two functional layers disposed a bottom pinned layer of a pinned layer stack and two functional layers disposed in a top pinned layer of the pinned layer stack according to an example embodiment.

FIG. 10 illustrates another MTJ cell 1000 including two functional layers disposed a bottom pinned layer of a pinned layer stack and two functional layers disposed in a top pinned layer of the pinned layer stack according to an example embodiment. The design of FIG. 10 is similar to the design of FIG. 9 except that the two pairs of functional layers are separated by an additional bottom pinned layer or top pin layer, as shown. In particular, the MTJ cell 1000 includes a bottom electrode 202, an AF layer 204 (e.g., PtMn), a pinned layer stack 1020, a tunneling barrier layer 212 (e.g., MgO), a free layer 214, and a capping/hardmask layer 216 (e.g., Ta). The pinned layer stack 1020 includes a first bottom pinned layer 206a (BP1) (e.g., CoFe and/or CoFeB), a second bottom pinned layer 206b (BP2) (e.g., CoFe and/or CoFeB), and a third bottom pinned layer 206c (BP3) (e.g., CoFe and/or CoFeB). The first and second bottom pinned layers 206a, 206b are interposed by a first bottom functional layer 1040a, and the second and third bottom pinned layers 206b, 206c are interposed by a second bottom functional layer 1040b. The pinned layer stack 1020 also includes a coupling layer 208 (e.g., Ru). The pinned layer stack 1020 further includes a first top pinned layer 210a (TP1) (e.g., CoFe and/or CoFeB), a second top pinned layer 210b (TP2) (e.g., CoFe and/or CoFeB), and a third top pinned layer 210c (TP3) (e.g., CoFe and/or CoFeB). The first and second top pinned layers 210a, 210b are interposed by a first top functional layer 1060a, and the second and third top pinned layers 210b, 210c are interposed by a second top functional layer 1060b.

As with the design of FIG. 9, in FIG. 10, the first bottom functional layer 940a is shown as a diffusion-barrier functional layer, the second bottom functional layer 940b is shown as replenishment functional layer, the first top functional layer 960a is shown as a replenishment functional layer, and the second top functional layer 960b is shown as a crystalline-enhancement functional layer. Again, the particular types, ordering, and number of functional layers shown are for illustration purposes only, and it will be appreciated that any combination, ordering, or number of functional layers is possible.

Figure 11:
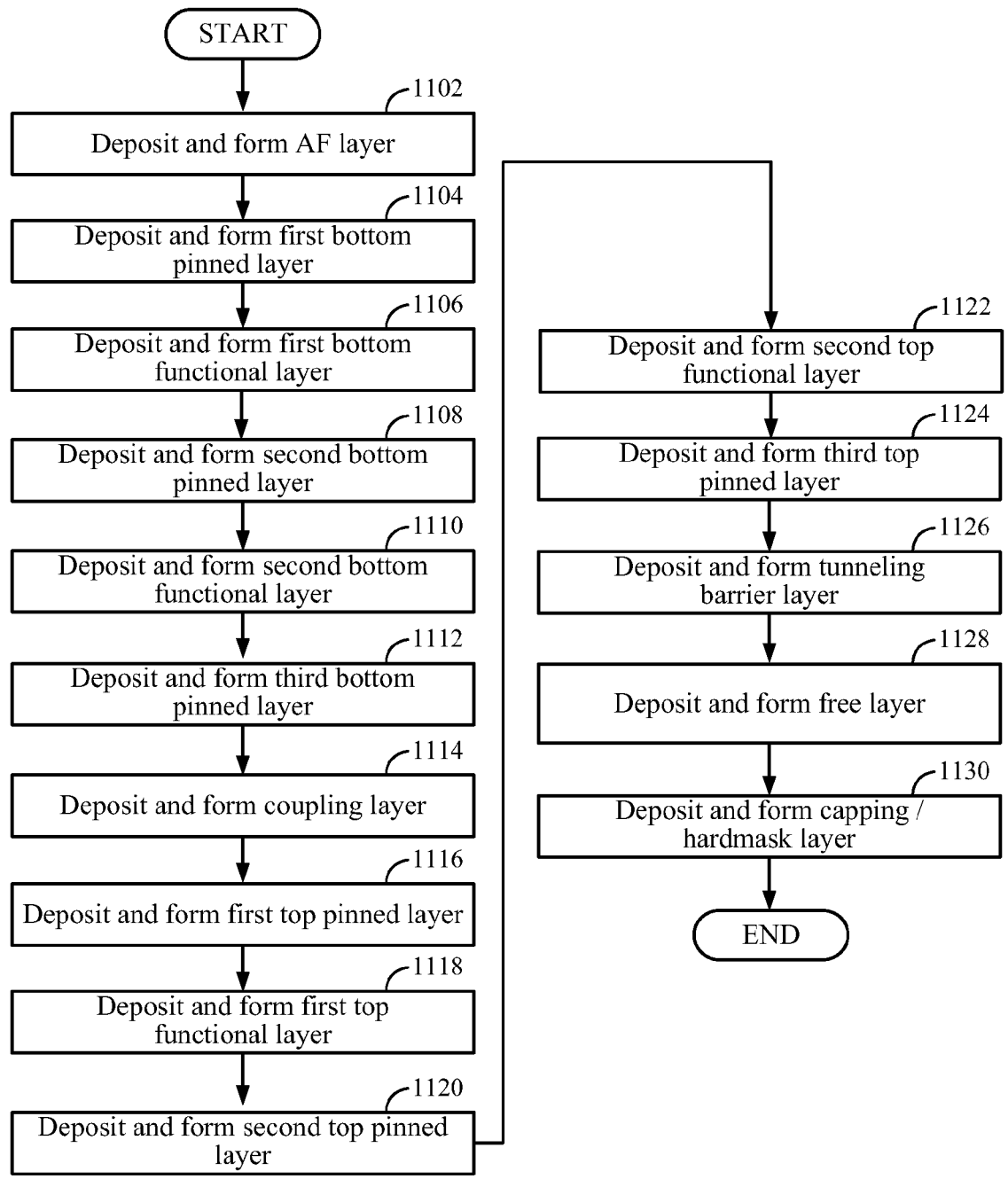
FIG. 11 illustrates a method of forming an MTJ cell according to an example embodiment.

FIG. 11 illustrates a method of forming an MTJ cell according to an example embodiment. The method illustrated in FIG. 11 is shown specifically for forming the MTJ cell 1000 of FIG. 10 because it is the most complex. It will be appreciated that the remaining designs disclosed herein may be formed in a similar manner by omitting one or more of the described steps. Initially, the AF layer 204 (e.g., PtMn) is deposited and formed on a bottom electrode 202 (block 1102). Processing then moves to the formation of the pinned layer stack 1020. The first bottom pinned layer 206a (BP1) (e.g., CoFe and/or CoFeB) is deposited and formed on the AF layer 204 (block 1104). The first bottom functional layer 1040a is deposited and formed on the first bottom pinned layer 206a (block 1106). The second bottom pinned layer 206b (BP2) (e.g., CoFe and/or CoFeB) is deposited and formed on the first bottom functional layer 1040a (block 1108). The second bottom functional layer 1040b is deposited and formed on the second bottom pinned layer 206b (block 1110). The third bottom pinned layer 206c (BP3) (e.g., CoFe and/or CoFeB) is deposited and formed on the second bottom functional layer 1040b (block 1112). The coupling layer 208 (e.g., Ru) is deposited and formed on the third bottom pinned layer 206c (block 1114). The first top pinned layer 210a (TP1) (e.g., CoFe and/or CoFeB) is deposited and formed on the coupling layer 208 (block 1116). The first top functional layer 1060a is deposited and formed on the first top pinned layer 210a (block 1118). The second top pinned layer 210b (TP2) (e.g., CoFe and/or CoFeB) is deposited and formed on the first top functional layer 1060a (block 1120). The second top functional layer 1060b is deposited and formed on the second top pinned layer 210b (block 1122). The third top pinned layer 210c (TP3) (e.g., CoFe and/or CoFeB) is deposited and formed on the second top functional layer 1060b (block 1124). The tunneling bather layer 212 (e.g., MgO) is deposited and formed on the third top pinned layer 210c (block 1126). The free layer 214 is deposited and formed on the third top pinned layer 210c (block 1128). The capping/hardmask layer 216 (e.g., Ta) is formed on the free layer 214 (block 1130). As discussed above, the particular types, ordering, and number of functional layers may be selected as desired. Further, it will be appreciated that in certain designs other intervening layers (not shown) may be deposited and formed between the illustrated layers. Depositing and forming each of the layers may include one or more well-known process steps, such as etching, chemical-mechanical polishing, magnetic annealing, etc.

It will be appreciated that memory devices including the MTJ storage elements described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory having MTJ storage elements as disclosed herein.

The foregoing disclosed devices and methods can be designed and can be configured into GDSII and GERBER computer files, stored on a computer-readable media. These files are in turn provided to fabrication handlers who fabricate devices based on these files. The resulting products are semiconductor wafers that are then be cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A magnetic tunnel junction (MTJ) storage element comprising:
    a pinned layer stack integrated in a Spin Transfer Torque Magnetoresistive Random Access Memory (STT-MRAM), the pinned layer stack being formed of a plurality of layers comprising a bottom pinned layer, a coupling layer, and a top pinned layer; and
    a first functional layer disposed in the bottom pinned layer or the top pinned layer, wherein the first functional layer is formed from a material comprising hafnium, tantalum, or ruthenium.

2. The MTJ storage element of claim 1, wherein the first functional layer protects the pinned layer stack from high-temperature diffusion of material through the plurality of layers.

3. The MTJ storage element of claim 1, wherein the first functional layer is a diffusion-barrier functional layer that impedes diffusion between layers, a crystalline-enhancement functional layer that promotes crystal formation, or a replenishment functional layer that provides replenishment atoms to fill vacancy positions in a neighboring layer.

4. The MTJ storage element of claim 1, wherein the bottom pinned layer or the top pinned layer in which the first functional layer is disposed comprises first and second layers, the first functional layer being interposed between the first and second layers.

5. The MTJ storage element of claim 1, further comprising a second functional layer disposed in the bottom pinned layer or the top pinned layer opposite the one in which the first functional layer is disposed.

6. The MTJ storage element of claim 5, wherein the second functional layer is formed from a different material than the first functional layer.

7. The MTJ storage element of claim 5, wherein the second functional layer is formed from the same material as the first functional layer.

8. The MTJ storage element of claim 1, further comprising a second functional layer disposed in the same bottom pinned layer or top pinned layer as the first functional layer.

9. The MTJ storage element of claim 1, further comprising an antiferromagnetic layer, a tunneling barrier layer, a free layer, and/or a capping layer.

10. The MTJ storage element of claim 1, wherein the storage element is integrated in an electronic device selected from the group consisting of a set top box, music player, video player, entertainment unit, navigation device, communications device, personal digital assistant (PDA), fixed location data unit, and a computer.

11. The MTJ storage element of claim 1, wherein the STT-MRAM device is integrated in at least one semiconductor die.

12. A method of forming a magnetic tunnel junction (MTJ) storage element, the method comprising:
    depositing and forming a plurality of layers in a Spin Transfer Torque Magnetoresistive Random Access Memory (STT-MRAM), the plurality of layers comprising a bottom pinned layer, a coupling layer, and a top pinned layer to form a pinned layer stack; and
    depositing and forming a first functional layer disposed in the bottom pinned layer or the top pinned layer, wherein the first functional layer is formed from a material comprising hafnium, tantalum, or ruthenium.

13. The method of claim 12, wherein the first functional layer protects the pinned layer stack from high-temperature diffusion of material through the plurality of layers.

14. The method of claim 12, wherein the first functional layer is a diffusion-barrier functional layer that impedes diffusion between layers, a crystalline-enhancement functional layer that promotes crystal formation, or a replenishment functional layer that provides replenishment atoms to fill vacancy positions in a neighboring layer.

15. The method of claim 12, wherein the bottom pinned layer or the top pinned layer in which the first functional layer is disposed comprises first and second layers, the first functional layer being interposed between the first and second layers.

16. The method of claim 12, further comprising depositing and forming a second functional layer disposed in the bottom pinned layer or the top pinned layer.

17. The method of claim 12, further comprising depositing and forming an antiferromagnetic layer, a tunneling barrier layer, a free layer, and/or a capping layer.

18. A magnetic tunnel junction (MTJ) storage element comprising:
   a pinned layer stack integrated in a Spin Transfer Torque Magnetoresistive Random Access Memory (STT-MRAM), the pinned layer stack being formed from a plurality of layers comprising a bottom pinned layer, a coupling layer, and a top pinned layer; and
   first means for protecting the pinned layer stack, the first means being disposed in the bottom pinned layer or the top pinned layer, wherein the first means comprises a material comprising hafnium, tantalum, or ruthenium.

19. The MTJ storage element of claim 18, wherein the first means protects the pinned layer stack from high-temperature diffusion of material through the plurality of layers.

20. The MTJ storage element of claim 18, wherein the first means comprises diffusion-barrier means for impeding diffusion between layers, crystalline-enhancement means for promoting crystal formation, or replenishment means for providing replenishment atoms to fill vacancy positions in a neighboring layer.

21. The MTJ storage element of claim 18, wherein the bottom pinned layer or the top pinned layer in which the first functional layer is disposed comprises first and second layers, the first functional layer being interposed between the first and second layers.

22. The MTJ storage element of claim 18, further comprising second means for protecting the pinned layer stack, the second means being disposed in the bottom pinned layer or the top pinned layer.

23. The MTJ storage element of claim 18, further comprising an antiferromagnetic layer, a tunneling barrier layer, a free layer, and/or a capping layer.

24. The MTJ storage element of claim 18, wherein the storage element is integrated in an electronic device selected from the group consisting of a set top box, music player, video player, entertainment unit, navigation device, communications device, personal digital assistant (PDA), fixed location data unit, and a computer.

25. The MTJ storage element of claim 18, wherein the STT-MRAM device is integrated in at least one semiconductor die.

26. A method of forming a magnetic tunnel junction (MTJ) storage element, the method comprising:
   step for depositing and forming a plurality of layers in a Spin Transfer Torque Magnetoresistive Random Access Memory (STT-MRAM), the plurality of layers comprising a bottom pinned layer, a coupling layer, and a top pinned layer to form a pinned layer stack; and
   step for depositing and forming a first functional layer disposed in the bottom pinned layer or the top pinned layer, wherein the first functional layer is formed from a material comprising hafnium, tantalum, or ruthenium.

27. The method of claim 26, wherein the first functional layer protects the pinned layer stack from high-temperature diffusion of material through the plurality of layers.

28. The method of claim 26, wherein the first functional layer is a diffusion-barrier functional layer that impedes diffusion between layers, a crystalline-enhancement functional layer that promotes crystal formation, or a replenishment functional layer that provides replenishment atoms to fill vacancy positions in a neighboring layer.

29. The method of claim 26, wherein the bottom pinned layer or the top pinned layer in which the first functional layer is disposed comprises first and second layers, the first functional layer being interposed between the first and second layers.

30. The method of claim 26, further comprising step for depositing and forming a second functional layer disposed in the bottom pinned layer or the top pinned layer.

31. The method of claim 26, further comprising step for depositing and forming an antiferromagnetic layer, a tunneling barrier layer, a free layer, and/or a capping layer.

32. The MTJ storage element of claim 1, wherein the first functional layer is a diffusion-barrier functional layer formed from a hafnium material selected from the group consisting of a hafnium-oxide (HfOx), a magnetic alloy including Hf, and a non-magnetic alloy including Hf.

33. The MTJ storage element of claim 1, wherein the first functional layer is a crystalline-enhancement functional layer formed from a tantalum material selected from the group consisting of a cobalt-iron-tantalum alloy (CoFeTa), a cobalt-iron-tantalum-oxide (CoFeTaOx), a cobalt-iron-boron-tantalum alloy (CoFeBTa), a cobalt-chromium-tantalum alloy (CoCrTa), and a cobalt-chromium-tantalum-oxide (CoCrTaOx).

34. The MTJ storage element of claim 1, wherein the first functional layer is a replenishment functional layer formed from a ruthenium or ruthenium alloy material.

35. The MTJ storage element of claim 1, wherein the first functional layer is formed from a material comprising hafnium or tantalum.

* * * * *